US008797042B2

(12) United States Patent
Ike et al.

(10) Patent No.: US 8,797,042 B2
(45) Date of Patent: Aug. 5, 2014

(54) GROUND FAULT DETECTION CIRCUIT AND GROUND FAULT DETECTION APPARATUS

(75) Inventors: Takehito Ike, Moriguchi (JP); Takayoshi Abe, Moriguchi (JP); Tomomichi Nakai, Moriguchi (JP); Takeshi Nakashima, Moriguchi (JP); Kazuo Ishimoto, Moriguchi (JP)

(73) Assignee: Sanyo Electric Co., Ltd. (JP)

( * ) Notice: Subject to any disclaimer, the term of this patent is extended or adjusted under 35 U.S.C. 154(b) by 107 days.

(21) Appl. No.: 13/427,088

(22) Filed: Mar. 22, 2012

(65) Prior Publication Data

US 2012/0182024 A1 Jul. 19, 2012

Related U.S. Application Data

(63) Continuation of application No. PCT/JP2011/072340, filed on Sep. 29, 2011.

(30) Foreign Application Priority Data

Oct. 8, 2010 (JP) .................................. 2010-228822
Aug. 10, 2011 (JP) .................................. 2011-174698

(51) Int. Cl.
*G01N 27/416* (2006.01)

(52) U.S. Cl.
USPC ............................. 324/509; 324/426; 324/437

(58) Field of Classification Search
USPC ............... 324/509, 426–437; 361/42; 307/80; 320/137
See application file for complete search history.

(56) References Cited

U.S. PATENT DOCUMENTS

| 7,486,082 B2 * | 2/2009 | Hachisuka et al. ........... 324/536 |
| 7,638,977 B2 * | 12/2009 | Park ............................... 320/136 |
| 2008/0223842 A1 * | 9/2008 | Petrenko et al. ............... 219/203 |

FOREIGN PATENT DOCUMENTS

| JP | 57-32427 A | 2/1982 |
| JP | 63-124732 A | 5/1988 |
| JP | 4-12616 A | 1/1992 |
| JP | 4012616 | * 1/1992 |
| JP | 2003-111301 A | 4/2003 |
| JP | 2006-158195 A | 6/2006 |
| JP | 2009-113554 A | 5/2009 |
| JP | 2010-187513 A | 8/2010 |

OTHER PUBLICATIONS

International Preliminary Report on Patentability for International Application No. PCT/JP2011/072340, issued May 8, 2013.
Written Opinion of the International Searching Authority for International Application No. PCT/JP2011/072340, mailed Jan. 10, 2012.
International Preliminary Report on Patentability for International Application No. PCT/JP2011/072340, issued Apr. 9, 2013, with English translation.
Notice of Grounds for Rejection for Japanese Patent Application No. 2010-228822, mailed Feb. 4, 2014. English translation attached.

\* cited by examiner

*Primary Examiner* — Melissa Koval
*Assistant Examiner* — Farhana Hoque
(74) *Attorney, Agent, or Firm* — Cantor Colburn LLP

(57) ABSTRACT

A ground fault detection circuit includes: a first switch circuit that connects/disconnects a first path between a positive bus bar and a ground potential section, the positive bus bar being connected to positive electrodes of secondary battery units through a field-effect transistor including a parasitic diode; a second switch circuit that connects/disconnects a second path between a negative bus bar and a ground potential section, the negative bus bar being connected to negative electrodes of the secondary battery units; and a ground fault detection unit that detects a ground fault of the positive bus bar or the negative bus bar based on an electric current flowing through the first path or the second path.

12 Claims, 6 Drawing Sheets

GROUND FAULT DETECTION CIRCUIT AND GROUND FAULT DETECTION APPARATUS

CROSS-REFERENCE TO RELATED APPLICATION

The present application is a continuation application of International Application No. PCT/JP2011/072340, filed Sep. 29, 2011, the entire contents of which are incorporated herein by reference and priority to which is hereby claimed. The PCT/JP2011/072340 application claimed the benefit of the date of the earlier filed Japanese Patent Application Nos. JP2010-228822, filed Oct. 8, 2010, and JP2011-174698, filed Aug. 10, 2011, the entire contents of which are incorporated herein by reference, and priority to which is hereby claimed.

TECHNICAL FIELD

The present invention generally relates to a ground fault detection circuit and a ground fault detection apparatus, and more particularly to a ground fault detection circuit and a ground fault detection apparatus that detect a ground fault of a positive bus bar or a negative bus bar.

An electricity storage device, such as a secondary battery, is used to use energy efficiently. For example, in recent years, a solar light power generation system has been actively developed for environmentally-friendly clean energy. However, since a photoelectric conversion module that converts solar light to power does not have an electricity storage function, the module is used in combination with a secondary battery in some cases. For example, energy is efficiently used based on charge/discharge control for temporarily charging the secondary battery with power generated by the photoelectric conversion module and discharging the power from the secondary battery according to a request or the like by an external load.

An example of a technique related to the present invention is described in Patent Literature 1, which discloses a power supply apparatus of a solar battery, the apparatus including: a solar battery; a plurality of secondary batteries charged by the solar battery; charge switches that are connected between the secondary batteries and the solar battery to control the charge of the secondary batteries; discharge switches connected between the secondary batteries and a load; and a control circuit that controls the charge switches and the discharge switches. The control circuit controls the plurality of charge switches to specify priorities of the secondary batteries to be charged and charges a secondary battery with a high priority before a secondary battery with a low priority. Once the secondary battery with the high priority is charged to a predetermined level, the secondary battery with the low priority is charged.

CITATION LIST

Patent Literature

Patent Literature 1: Japanese Patent Laid-Open Publication No. 2003-111301

SUMMARY OF INVENTION

Technical Problem

There is a power supply system in which a positive bus bar connected to a positive terminal of a secondary battery and a negative bus bar connected to a negative terminal of the secondary battery are not grounded (earthed). In this case, if a human body touches the positive bus bar or the negative bus bar when the positive bus bar or the negative bus bar is grounded, a current loop that passes through the body is formed, and an electric current flows through the human body. It is desirable to detect the ground fault to prevent such an incident.

An advantage of the present invention is provision of a ground fault detection circuit and a ground fault detection apparatus that detect a ground fault.

Solution to Problem

The present invention provides a ground fault detection circuit including: a first switch circuit that connects or disconnects a first path between a positive bus bar and a ground potential section, the positive bus bar being connected to a positive electrode of a secondary battery unit through a field-effect transistor including a parasitic diode; a second switch circuit that connects or disconnects a second path between a negative bus bar and the ground potential section, the negative bus bar being connected to a negative electrode of the secondary battery unit; and a ground fault detection unit that detects a ground fault of the positive bus bar or the negative bus bar based on an electric current flowing through the first path or the second path.

The present invention provides a ground fault detection apparatus including: the ground fault detection circuit; and a control unit that controls execution timing of the detection of the ground fault, wherein the control unit sets a plurality of target periods discretely arranged on a time line and controls the ground fault detection circuit to detect the ground fault in each target period.

Advantageous Effect of Invention

According to the ground fault detection circuit and the ground fault detection apparatus having the above-described configurations, a ground fault of the positive bus bar or the negative bus bar can be detected based on the electric current flowing through the first path or the second path.

DESCRIPTION OF EMBODIMENTS

Figure 1:
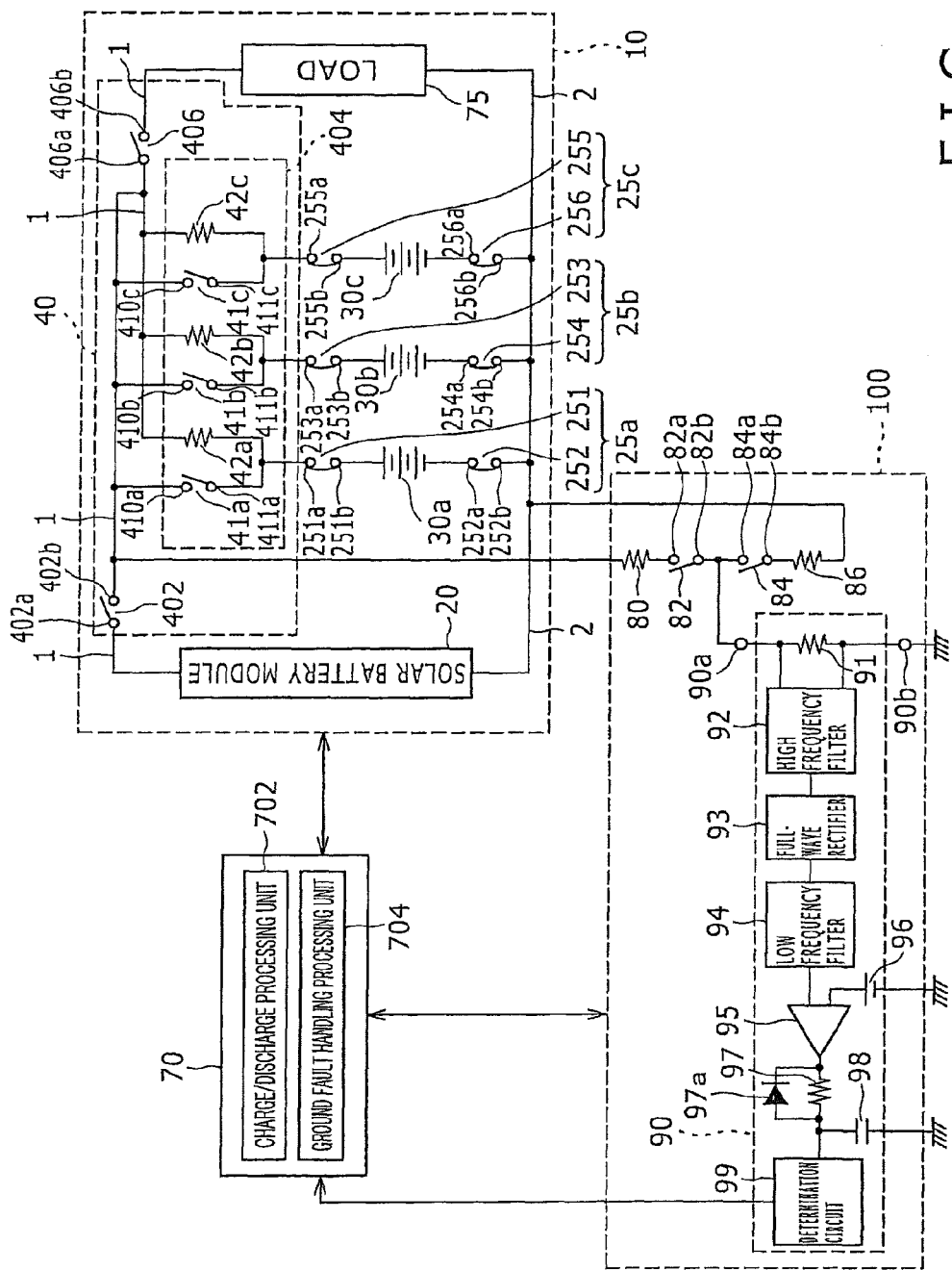
FIG. 1 is a view showing a ground fault detection circuit, a control unit, and a power supply system for which the ground fault detection circuit detects a ground fault according to a first embodiment of the present invention.

Hereinafter, embodiments of the present invention will be described in detail with reference to the drawings. Although in the description below a secondary battery is specified as a lithium-ion secondary battery, other storage batteries that can be charged and discharged may also be used. For example, a nickel hydride secondary battery, a nickel-cadmium storage battery, a lead storage battery, or a metallic lithium-ion secondary battery may also be used.

Hereinafter, identical elements are designated with the same reference numerals throughout all drawings, and overlapping description will be omitted. In the description of the text, previously described reference numerals will be used as necessary.

First Embodiment

FIG. 1 is a view showing an electricity storage system 8. The electricity storage system 8 includes a ground fault detection circuit 100, a control unit 70, and a power supply system 10 for which the ground fault detection circuit 100 detects a ground fault. The power supply system 10 will be described first, and then the ground fault detection circuit 100 and the control unit 70 will be described. The electricity storage system 8 of FIG. 1 can include a ground fault detection apparatus. The ground fault detection apparatus included in the electricity storage system 8 includes at least the ground fault detection circuit 100 and a ground fault handling processing unit 704 as constituent elements and can further include other arbitrary components shown in FIG. 1 as constituent elements.

The power supply system 10 includes a solar battery module 20, breaker units 25a, 25b, and 25c, secondary battery units 30a, 30b, and 30c, a switch apparatus 40, and a load 75.

The solar battery module 20 is a photoelectric conversion apparatus that converts solar light to electric power. A positive terminal of the solar battery module 20 is connected to a terminal 402a on one side of a charge switch circuit 402 through a positive bus bar 1. A negative terminal of the solar battery module 20 is connected to negative terminals 252b, 254b, and 256b of negative breakers 252, 254, and 256 of the breaker units 25a, 25b, and 25c and to a negative terminal of the load 75 through a negative bus bar 2. The electric power generated by the solar battery module 20 is DC power.

A plurality of secondary batteries are connected in series in each of the secondary battery units 30a, 30b, and 30c. Each secondary battery includes a negative electrode made of a carbon material, an electrolyte for lithium ions to move through, and a positive active material that can reversibly take lithium ions in and out.

A positive terminal of the secondary battery unit 30a is connected to a parallel processing circuit unit 404 through a positive breaker 251 of the breaker unit 25a, and a negative terminal is connected to the negative bus bar 2 through the negative breaker 252 of the breaker unit 25a. As shown in FIG. 1, the secondary battery unit 30b and the secondary battery unit 30c also have the same configuration as the secondary battery unit 30a.

The breaker units 25a, 25b, and 25c are devices that are disconnected and controlled by the control unit 70 when the secondary battery units 30a, 30b, and 30c require protection.

The breaker unit 25a includes the positive breaker 251 and the negative breaker 252. The positive breaker 251 is a disconnection circuit in which a terminal 251a on one side is connected to the parallel processing circuit unit 404, and a terminal 251b on the other side is connected to the positive terminal of the secondary battery unit 30a. The negative breaker 252 is a disconnection circuit in which a terminal 252a on one side is connected to the negative terminal of the secondary battery unit 30a, and the terminal 252b on the other side is connected to the negative bus bar 2. As shown in FIG. 1, the breaker unit 25b and the breaker unit 25c have the same configuration as the breaker unit 25a.

The switch apparatus 40 includes the charge switch circuit 402, the parallel processing circuit unit 404, and a discharge switch circuit 406.

The parallel processing circuit unit 404 includes switch circuits 41a, 41b, and 41c and resistance elements 42a, 42b, and 42c.

The switch circuit 41a is a switch in which a terminal 410a on one side is connected to a terminal 402b on the other side of the charge switch circuit 402 and to a terminal 406a on one side of the discharge switch circuit 406, and a terminal 411a on the other side is connected to the terminal 251a on one side of the positive breaker 251. The switch circuit 41a can be formed from, for example, a field-effect transistor (FET). In this case, a cathode terminal is connected to the terminal 402a on one side, and an anode terminal is connected to the terminal 402b on the other side to form a parasitic diode. As shown in FIG. 1, the switch circuit 41b and the switch circuit 41c have the same configuration as the switch circuit 41a.

A terminal on one side of the resistance element 42a is connected to the terminal 402b on the other side of the charge switch circuit 402 and to the terminal 406a on one side of the discharge switch circuit 406, and a terminal on the other side is connected to the terminal 251a on one side of the positive breaker 251. Therefore, the resistance element 42a is connected in parallel with the switch circuit 41a. The resistance element 42b and the resistance element 42c have the same configuration as the resistance element 42a.

An operation of the parallel processing circuit unit 404 will be described. During a normal operation, the control unit 70 controls on/off of the switch circuits 41a, 41b, and 41c in accordance with a potential difference in voltage at the positive terminals. On-resistance values of the switch circuits 41a, 41b, and 41c are smaller than resistance values of the resistance elements 42a, 42b, and 42c, respectively. Therefore, when the control unit 70 controls the charge switch circuit 402 to be on, the secondary battery units 30a, 30b, and 30c are charged with the electric power generated by the solar battery module 20 through the switch circuits 41a, 41b, and 41c, respectively.

For example, when the secondary battery unit 30b is replaced, there is a voltage difference between a terminal 253a on one side of a positive breaker 253 and terminals 251a and 255a on one side of positive breakers 251 and 255, and at this point, the control unit 70 controls the switch circuit 41b to be off. As a result, the secondary battery units 30a and 30c are charged with the electric power generated by the solar battery module 20 through the switch circuits 41a and 41c, but the second battery unit 30b is not charged. When the voltage of the secondary battery unit 30b is lower than the voltages of the secondary battery units 30a and 30c, there is a voltage difference between the terminals 251a and 255a on one side of the positive breakers 251 and 255 and the terminal 253a on one side of the positive breaker 253. Therefore, the current flows toward the positive breaker 253 through the resistance element 42a and the resistance element 42b or through the resistance element 42c and the resistance element 42b, and the voltage difference is reduced.

The charge switch circuit 402 is a switch in which the terminal 402a on one side is connected to the positive terminal of the solar battery module 20 through the positive bus bar 1. The terminal 402b on the other side is connected to terminals 410a, 410b, and 410c on one side of the switch circuits 41a, 41b, and 41c, to the terminals on one side of the resistance elements 42a, 42b, and 42c, and to the terminal 406a on one side of the discharge switch circuit 406 through the positive bus bar 1. The control unit 70 controls switching of the charge switch circuit 402. The charge switch circuit 402 can be formed from, for example, a field-effect transistor (FET). In this case, the anode terminal is connected to the terminal 402b on the other side, and the cathode terminal is connected to the terminal 402a on one side to form a parasitic diode.

The discharge switch circuit 406 is a switch in which the terminal 406a on one side is connected to the terminal 402b on the other side of the charge switch circuit 402, to the terminals 410a, 410b, and 410c on one side of the switch circuits 41a, 41b, and 41c, and to the terminals on one side of the resistance elements 42a, 42b, and 42c through the positive bus bar 1. The discharge switch circuit 406 is a switch in which a terminal 406b on the other side is connected to the load 75 through the positive bus bar 1. The control unit 70 controls switching of the discharge switch circuit 406. The discharge switch circuit 406 can be formed from, for example, a field-effect transistor (FET). In this case, the cathode terminal is connected to the terminal on one side 406a, and the anode terminal is connected to the terminal 406b on the other side to form a parasitic diode.

The load 75 is a load device in which a terminal on one side is connected to the terminal 406b on the other side of the discharge switch circuit 406 through the positive bus bar 1, and a terminal on the other side is connected to the negative bus bar 2. Here, the load 75 is a load operated by DC power, and can be, for example, a personal computer.

The ground fault detection circuit 100 will be described. The ground fault detection circuit 100 includes a first resistance element 80, a first switch circuit 82, a ground fault detection unit 90, a second switch circuit 84, and a second resistance element 86.

The first resistance element 80 is a resistance element in which a terminal on one side is connected to the positive bus bar 1, and a terminal on the other side is connected to a terminal 82a on one side of the first switch circuit 82. A resistance value of the first resistance element 80 is a predetermined value for limiting a value of the current that flows when the negative bus bar 2 is grounded.

The terminal 82a on one side of the first switch circuit 82 is connected to the terminal on the other side of the first resistance element 80, and a terminal 82b on the other side is connected to a terminal 84a on one side of the second switch circuit 84 and to a terminal 90a on one side of the ground fault detection unit 90. The first switch circuit 82 can be formed from, for example, a field-effect transistor (FET). In this case, the anode terminal is connected to the terminal 82a on one side, and the cathode terminal is connected to the terminal 82b on the other side to form a parasitic diode. The control unit 70 controls switching of the first switch circuit 82.

The terminal 84a on one side of the second switch circuit 84 is connected to the terminal 82b on the other side of the first switch circuit 82 and to the terminal 90a on one side of the ground fault detection unit 90, and a terminal 84b on the other side is connected to a terminal on one side of the second resistance element 86. The second switch circuit 84 can be formed from, for example, a field-effect transistor (FET). In this case, the cathode terminal is connected to the terminal 84a on one side, and the anode terminal is connected to the terminal 84b on the other side to form a parasitic diode. The control unit 70 controls switching of the second switch circuit 84.

The second resistance element 86 is a resistance element in which a terminal on one side is connected to the terminal on the other side of the second switch circuit 84, and a terminal on the other side is connected to the negative bus bar 2. A resistance value of the second resistance element 86 is a predetermined value for limiting a value of the current that flows when the positive bus bar 1 is grounded.

The ground fault detection unit 90 includes an I/V conversion resistance element 91, a high frequency filter 92, a full-wave rectifier circuit 93, a low frequency filter 94, a comparator 95, a reference voltage circuit 96, a resistance element 97, a capacitative element 98, and a determination circuit 99. The terminal 90a on one side of the ground fault detection unit 90 is connected to a connection point between the first switch circuit 82 and the second switch circuit 84, and a terminal 90b on the other side is grounded.

The I/V conversion resistance element 91 is a resistance element in which a terminal on one side is connected to a connection point between the first switch circuit 82 and the second switch circuit 84 through the terminal 90a on one side, and a terminal on the other side is grounded through the terminal 90b on the other side. The current flowing through the I/V conversion resistance element 91 is converted to a voltage by resistance components.

The high frequency filter 92 is a filter circuit in which two input terminals are connected to terminals on respective sides of the I/V conversion resistance element 91, and an output terminal is connected to an input terminal of the full-wave rectifier circuit 93. The high frequency filter 92 receives a voltage signal output from the I/V conversion resistance element 91 as an input and functions as a filter that cuts high frequency (e.g. 15 kHz to 20 kHz) components of the voltage signal.

The full-wave rectifier circuit 93 is a rectifier circuit in which the input terminal is connected to the output terminal of the high frequency filter 92, and an output terminal is connected to an input terminal of the low frequency filter 94. The full-rectifier circuit 93 functions as a rectifier circuit that fully rectifies the voltage signal filtered by the high frequency filter 92.

The low frequency filter 94 is a filter circuit in which the input terminal is connected to the output terminal of the full-wave rectifier circuit 93, and an output terminal is connected to a first input terminal of the comparator 95. The low frequency filter 94 is a filter circuit that cuts low frequency (e.g. 100 Hz to 120 Hz) components of the voltage signal rectified by the full-wave rectifier circuit 93.

The reference voltage circuit 96 is a circuit in which a terminal on one side is connected to a second input terminal of the comparator 95, and a terminal on the other side is grounded. The reference voltage circuit 96 has a function of outputting a predetermined reference voltage value (threshold) for detecting a ground fault of the positive bus bar 1 or the negative bus bar 2.

The comparator 95 is a comparison circuit in which the first input terminal is connected to the output terminal of the low frequency filter 94, the second input terminal is connected to the terminal on one side of the reference voltage circuit 96, and an output terminal is connected to a terminal on one side of the resistance element 97 and a cathode terminal of a diode 97a. The comparator 95 has a function of comparing the voltage signal filtered by the low frequency filter 94 and the voltage value output by the reference voltage circuit 96. The comparator 95 outputs Low when the value of the voltage signal is greater than the reference voltage value and outputs High when the value of the voltage signal is smaller than the reference voltage value.

The resistance element 97 is a resistance element in which the terminal on one side is connected to the output terminal of the comparator 95 and to the cathode terminal of the diode 97a. A terminal on the other side is connected to a terminal on one side of the capacitative element 98, to an input terminal of the determination circuit 99, and to an anode terminal of the diode 97a.

The diode 97a is a diode in which the cathode terminal is connected to the terminal on one side of the resistance element 97 and the output terminal of the comparator 95. The anode terminal is connected to the terminal on the other side of the resistance element 97, to the terminal on one side of the capacitative element 98, and to the input terminal of the determination circuit 99. Therefore, the diode 97a is connected in parallel with the resistance element 97. The diode 97a functions as a discharge circuit that discharges the charge stored in the capacitative element 98.

The capacitative element 98 is a capacitative element in which the terminal on one side is connected to the terminal on the other side of the resistance element 97, to the anode terminal of the diode 97a, and to the input terminal of the determination circuit 99. A terminal on the other side is grounded. The resistance element 97 and the capacitative element 98 together function as a time constant circuit, and specifically, function as a time constant circuit that changes a value based on a time constant determined by the resistance value of the resistance element 97 and the capacitance value of the capacitative element 98 based on a change in the output value of the comparator 95.

The determination circuit 99 is a circuit in which the input terminal is connected to the terminal on the other side of the resistance element 97, to the anode terminal of the diode 97a, and to the terminal on one side of the capacitative element 98. An output terminal of the determination circuit 99 is connected to the control unit 70. The determination circuit 99 determines whether the time over which an output value of the time constant circuit formed by the resistance element 97 and the capacitative element 98 (potential of the terminal on the other side of the resistance element 97 and the terminal on one side of the capacitative element 98) changes from Low to High is beyond a predetermined determination time (e.g. two seconds). If a change signal of the output value of the time constant circuit is not beyond the determination time, the determination circuit 99 determines that there is no ground fault and outputs Low. If the duration of the change signal is beyond the determination time, the determination circuit 99 determines that there is a ground fault and outputs High.

The control unit 70 will be described. The control unit 70 includes a charge/discharge processing unit 702 and the ground fault handling processing unit 704. The components of the control unit 70 may be formed by hardware or may be formed by software.

The charge/discharge processing unit 702 has a function of controlling on/off of the charge switch circuit 402 and the discharge switch circuit 406. The charge/discharge processing unit 702 has a function of turning on the charge switch circuit 402 and the discharge switch circuit 406 to temporarily charge the secondary battery units 30a, 30b, and 30c with the electric power generated by the solar battery module 20 and to supply the discharge power discharged from the secondary battery units 30a, 30b, and 30c to the load 75.

The charge/discharge processing unit 702 also has a function of acquiring SOCs of the secondary battery units 30a, 30b, and 30c and turning off the charge switch circuit 402 to prevent the secondary battery units 30a, 30b, and 30c from being overcharged when at least one of the SOCs of the secondary battery units 30a, 30b, and 30c is greater than a predetermined overcharge reference value.

The charge/discharge processing unit 702 also has a function of acquiring the SOCs of the secondary battery units 30a, 30b, and 30c and turning off the discharge switch circuit 406 to prevent the secondary battery units 30a, 30b, and 30c from being overdischarged when at least one of the SOCs of the secondary battery units 30a, 30b, and 30c is smaller than a predetermined overdischarge reference value.

The ground fault handling processing unit 704 has a function of controlling the first switch circuit 82, the second switch circuit 84, and the breaker units 25a, 25b, and 25c.

The ground fault handling processing unit 704 also has a function of turning off the first switch circuit 82 and turning on the second switch circuit 84 to detect whether the positive bus bar 1 is grounded. If the positive bus bar 1 is grounded, a current path is formed in which an electric current flows from the ground to the negative bus bar 2 through the I/V conversion resistance element 91, the second switch circuit 84, and the second resistance element 86. If the positive bus bar 1 is grounded, the ground fault detection unit 90 detects the ground fault, and the output signal of the determination circuit 99 becomes High. The ground fault handling processing unit 704 determines that the positive bus bar 1 is grounded and disconnects the breaker units 25a, 25b, and 25c.

The ground fault handling processing unit 704 further turns on the first switch circuit 82 and turns off the second switch circuit 84 to detect whether the negative bus bar 2 is grounded. If the negative bus bar 2 is grounded, a current path is formed in which an electric current flows from the positive bus bar 1 to the ground through the first resistance element 80, the first switch circuit 82, and the I/V conversion resistance element 91. If the negative bus bar 2 is grounded, the ground fault detection unit 90 detects the ground fault, and the output signal of the determination circuit 99 becomes High. The ground fault handling processing unit 704 determines that the negative bus bar 2 is grounded and disconnects the breaker units 25a, 25b, and 25c.

Figure 2:
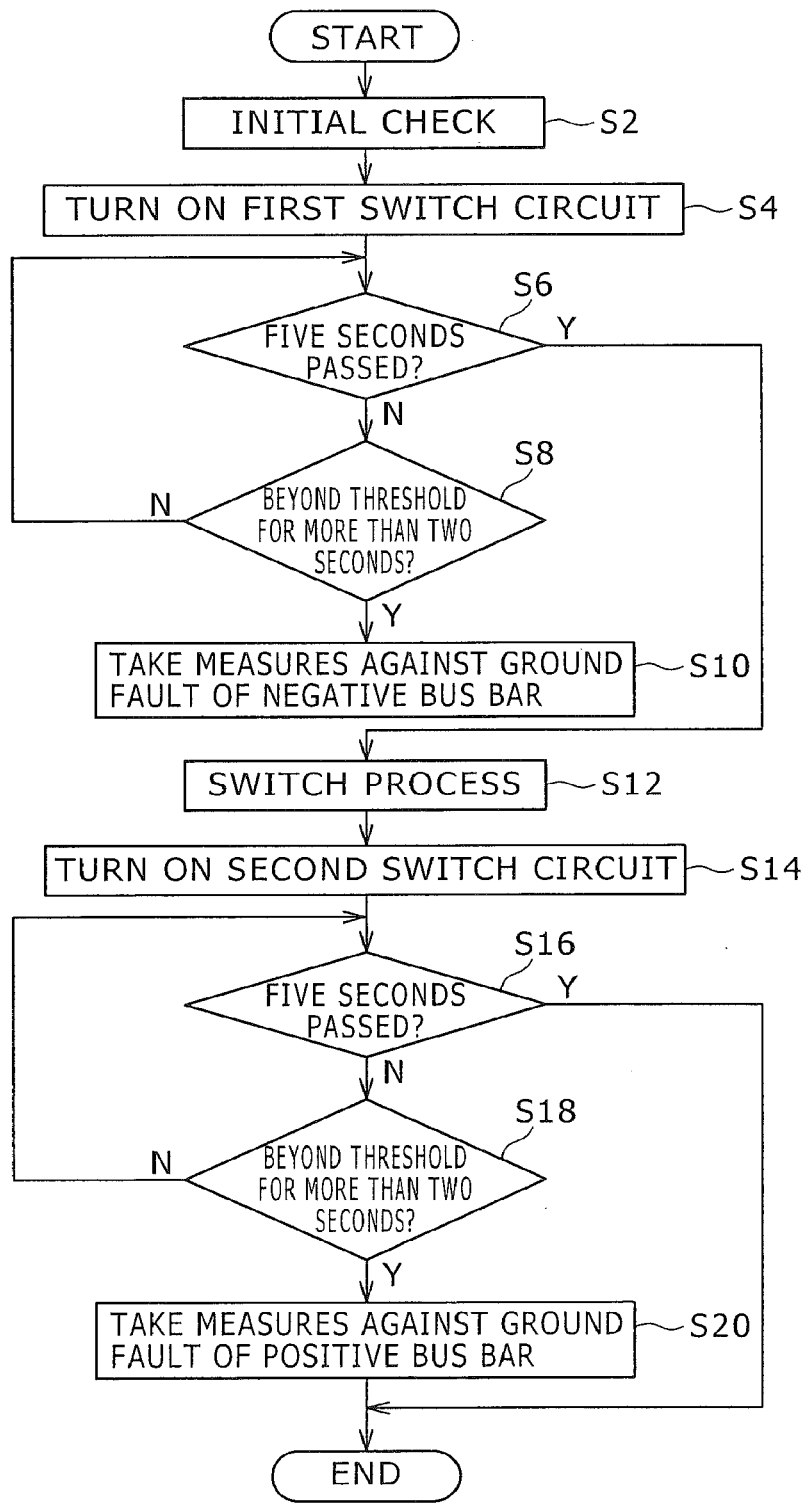
FIG. 2 is a flow chart showing a procedure of the ground fault detection performed by the ground fault detection circuit according to the first embodiment of the present invention.

An operation of the configuration will be described with reference to FIG. 2. FIG. 2 is a flow chart showing a procedure of ground fault detection by the ground fault detection circuit 100. Firstly, the first switch circuit 82 and the second switch circuit 84 are turned off to check that a current does not flow through the I/V conversion resistance element 91 (S2). This step is executed by a function of the ground fault handling processing unit 704 of the control unit 70. In this way, an initial check is performed to check whether the ground fault detection circuit 100 is in a normal state.

The first switch circuit 82 is turned on (S4). This step is executed by a function of the ground fault handling processing unit 704 of the control unit 70. In this way, the detection of whether the negative bus bar 2 is grounded is started. A determination is made as to whether five seconds have passed since the start of the ground fault detection of the negative bus bar 2 (S6). This step is executed by a function of the ground fault handling processing unit 704 of the control unit 70. If it is determined that five seconds have passed since the start of the ground fault detection of the negative bus bar 2, processing proceeds to S12.

If it is determined that five seconds have not passed since the start of the ground fault detection of the negative bus bar 2, a determination is made as to whether the output signal of the determination circuit 99 is High (S8). This step is executed by a function of the ground fault handling processing unit 704 of the control unit 70. If the output signal of the determination circuit 99 is Low, processing returns to S6.

If the output signal of the determination circuit 99 is High, it is determined that the negative bus bar 2 is grounded, and the breaker units 25a, 25b, and 25c are disconnected (S10). This step is executed by a function of the ground fault handling processing unit 704 of the control unit 70.

In step S12, three seconds after the first switch circuit 82 is turned OFF (S12), the second switch circuit 84 is turned ON (S14). This step is executed by a function of the ground fault handling processing unit 704 of the control unit 70. The ground fault detection related to the negative bus bar 2 is finished, and the detection of whether the positive bus bar 1 is grounded is started. The reason that the first switch circuit 82 is turned OFF and the second switching circuit 84 is turned ON after three seconds is that when the output of the comparator 95 is switched from High to Low after detection of a ground fault of the negative bus bar 2 just before the first switch circuit 82 is switched OFF, a determination has to be made as to whether more than two seconds have passed for the High signal. In the description of steps S12 and S14, the second switch circuit 84 is turned ON three seconds after the first switch circuit 82 is turned OFF. However, if the discharge function of the diode 97a can reduce the time required to switch the output of the comparator 95 from High to Low, the second switch circuit 84 may be turned on before three seconds have passed since the first switch circuit 82 is turned OFF.

A determination is made as to whether five seconds have passed since the start of the ground fault detection of the positive bus bar 1 (S16). This step is executed by a function of the ground fault handling processing unit 704 of the control unit 70. If it is determined that five seconds have passed since the start of the ground fault detection of the positive bus bar 1, processing proceeds to an END process.

If it is determined that five seconds have not passed since the start of the ground fault detection of the positive bus bar 1, a determination is made as to whether the output signal of the determination circuit 99 is High (S18). This step is executed by a function of the ground fault handling processing unit 704 of the control unit 70. If the output signal of the determination circuit 99 is Low, processing returns to S16.

If the output signal of the determination circuit 99 is High, it is determined that the positive bus bar 1 is grounded, and the breaker units 25a, 25b, and 25c are disconnected (S20). This step is executed by a function of the ground fault handling processing unit 704 of the control unit 70.

According to the configuration, the breaker units 25a, 25b, and 25c are disconnected when there is a ground fault based on the result of the ground fault detection by the ground fault detection circuit 100. In this way, an electric shock can be prevented even if a person touches the positive bus bar 1 or the negative bus bar 2 when the positive bus bar 1 or the negative bus bar 2 is grounded.

According to the configuration, the ground fault of the negative bus bar 2 can be detected when the first switch circuit 82 is turned ON and the second switch circuit 84 is turned OFF. The ground fault of the positive bus bar 1 can also be detected when the first switch circuit 82 is turned ON and the second switch circuit 84 is turned ON. Instead of the positive bus bar 1 or the negative bus bar 2, if there is a ground fault between the plurality of secondary batteries connected in series in the secondary battery units 30a, 30b, and 30c, the ground fault is detected both in the detection of the ground fault of the positive bus bar 1 and in the detection of the ground fault of the negative bus bar 2. In this way, the breaker units 25a, 25b, and 25c are disconnected even if there is a ground fault between the plurality of secondary batteries, and an electric shock can be prevented even if a person touches the positive bus bar 1 or the negative bus bar 2.

Figure 3:
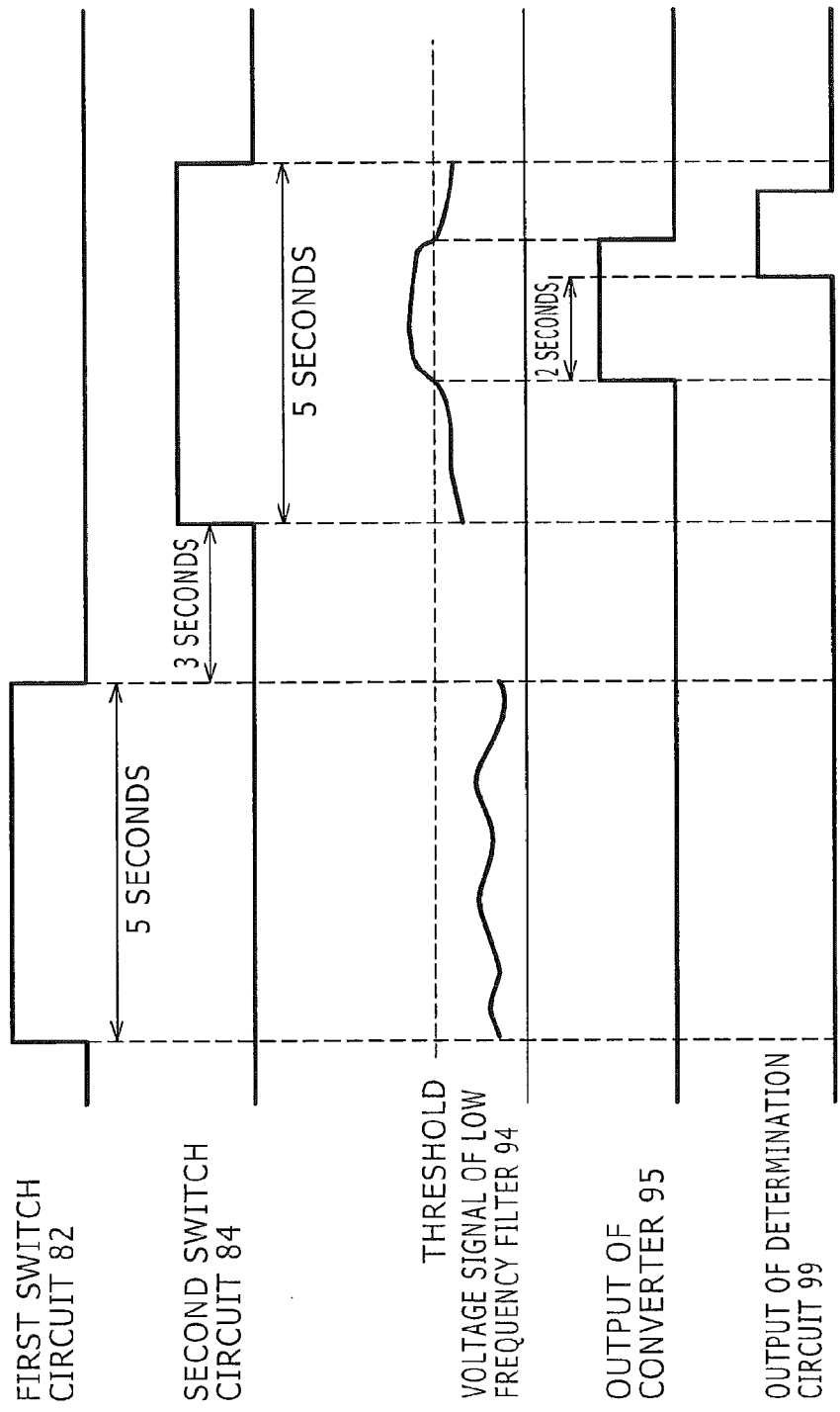
FIG. 3 is a timing chart of detection of a ground fault when a positive bus bar is grounded according to the first embodiment of the present invention.

An example of the detection of the ground fault by the power supply system 10 with the configuration will be described with reference to FIG. 3. FIG. 3 is a timing chart of detection of a ground fault when the positive bus bar 1 is grounded.

The first switch circuit 82 is turned ON for five seconds to determine whether the negative bus bar 2 is grounded. In this case, the negative bus bar 2 is not grounded, and the voltage signal as the output signal of the low frequency filter 94 is not beyond the reference voltage value (threshold). Therefore, the output of the comparator 95 remains Low.

After three seconds since the first switch circuit 82 is turned OFF, the second switch circuit 84 is turned ON for five seconds to determine whether the positive bus bar 1 is grounded. In this case, the positive bus bar 1 is grounded, and a period during which the voltage signal of the low frequency filter 94 is beyond the threshold continues for more than two seconds. Based on this, the determination circuit 99 determines that there is a ground fault and changes the output signal for the control unit 70 from Low to High. Therefore, the control unit 70 that has received the output signal can disconnect the breaker units 25a, 25b, and 25c in response to the generation of the ground fault.

The detection of the ground fault based on the configuration is performed, for example, about once a day. In this case, it is preferable to detect the ground fault when both the charge switch circuit 402 and the discharge switch circuit 406 are ON. Therefore, opportunities for detecting the ground fault can be arranged at predetermined intervals (e.g. ten minutes) to retry the ground fault detection. Specifically, if the ground fault detection is performed when both the charge switch circuit 402 and the discharge switch circuit 406 are ON, the ground fault detection of that day is finished. If one of the charge switch circuit 402 and the discharge switch circuit 406 is ON and the other is OFF, the ground fault detection can be performed once in this state, and then the ground fault detection can be retried until the other switch circuit is turned ON.

Second Embodiment

Figure 4:
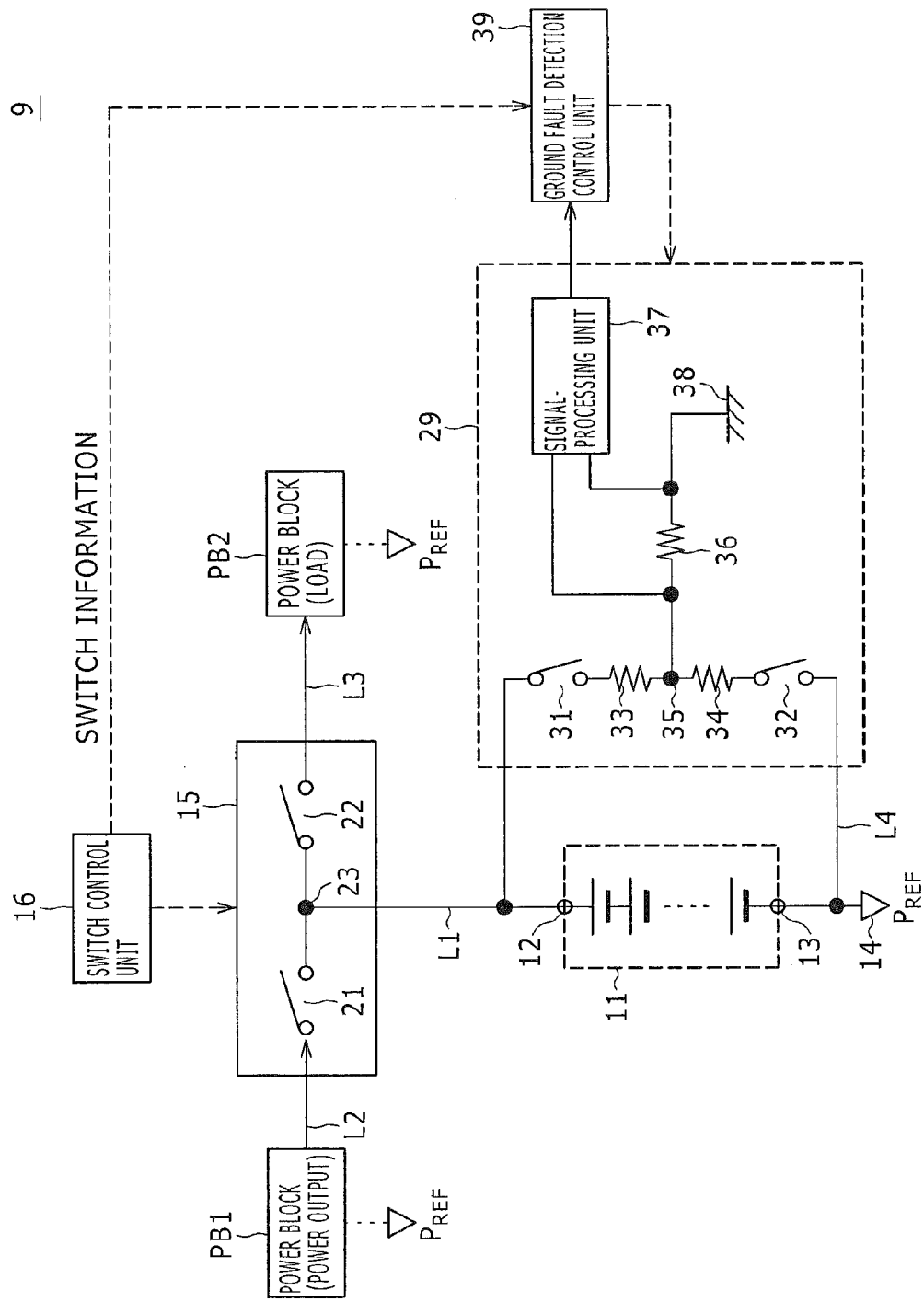
FIG. 4 is a schematic configuration diagram of an electricity storage system according to a second embodiment of the present invention.

FIG. 4 is a schematic configuration diagram of an electricity storage system 9. The electricity storage system 9 includes all or part of the components shown in FIG. 4. The electricity storage system 9 of FIG. 4 corresponds to the electricity storage system 8 of FIG. 1. For example, a power block PB1, a power block PB2, a charge switch circuit 21, a discharge switch circuit 22, a ground fault detection circuit 29, and a ground fault detection control unit 39 in FIG. 4 can correspond to the solar battery module 20, the load 75, the charge switch circuit 402, the discharge switch circuit 406, the ground fault detection circuit 100, and the ground fault handling processing unit 704 in FIG. 1, respectively. Description of elements similar to those of the first embodiment will be omitted as necessary.

A secondary battery unit 11 includes one or more secondary batteries that store power. The secondary batteries forming the secondary battery unit 11 are secondary batteries of an arbitrary type such as lithium-ion batteries or nickel hydride batteries. Although the number of the secondary batteries forming the secondary battery unit 11 may be one, in the first and second embodiments the secondary battery unit 11 includes a plurality of secondary batteries connected in series. However, part or all of the secondary batteries included in the secondary battery unit 11 may be a plurality of secondary batteries connected in parallel. In the secondary battery unit 11, a positive electrode of the secondary battery located on the highest potential side among the plurality of secondary batteries connected in series is connected to a positive terminal 12, and a negative electrode of the secondary battery located on the lowest potential side is connected to a negative terminal 13. The positive terminal 12 and the negative terminal 13 form a pair of input/output terminals in the secondary battery unit 11, and the secondary battery unit 11 is charged and discharged through the pair of input/output terminals. The negative terminal 13 is connected to a reference potential point 14 with a reference potential PREF. In the electricity storage system 9, wiring maintained at the reference potential PREF will be called a "negative bus bar L4." In the first and second embodiments, unless otherwise specified, discharge and charge denote discharge and charge of the secondary battery unit 11 (more specifically, discharge and charge of the secondary batteries in the secondary battery unit 11).

The positive terminal 12 of the secondary battery unit 11 is connected to a switching circuit 15 through a positive bus bar L1, while one or more power blocks for outputting or receiving power are connected to the switching circuit 15. The switching circuit 15 exists between the one or more power blocks and the secondary battery unit 11 and switches the connection or disconnection between the power blocks and the secondary battery unit 11 under the control of a switch control unit 16. Although the number of the power blocks connected to the switching circuit 15 may be any number so long as the number is one or more, it is assumed here that the power block PB1 that outputs power and the power block PB2 that receives power are connected to the switching circuit 15.

The switching circuit 15 includes the charge switch circuit 21 (hereinafter, also simply called "first switch 21") existing in series between the power block PB1 and the secondary battery unit 11 and the discharge switch circuit 22 (hereinafter, also simply called "second switch 22") existing in series between the power block PB2 and the secondary battery unit 11. The charge switch circuit 21 and the discharge switch circuit 22 as well as a first switch circuit 31 and a second switch circuit 32 described later can be formed from arbitrary types of semiconductor switching elements or mechanical switching elements. For example, metal-oxide-semiconductor field-effect transistors or insulated gate bipolar transistors can be used to form the charge switch circuit 21 and the discharge switch circuit 22 as well as the first switch circuit 31 and the second switch circuit 32 described later.

The charge switch circuit 21 and the discharge switch circuit 22 include first and second conduction terminals, respectively, and are turned ON or OFF under the control of the switch control unit 16. In an arbitrary switch including the charge switch circuit 21 and the discharge switch circuit 22 as well as the first switch circuit 31 and the second switch circuit 32 described later, the "ON" of the switch denotes a state in which first and second conduction terminals of the switch are connected and the first and second conduction terminals of the switch are connected. The "OFF" of the switch denotes a state in which the first and second conduction terminals of the switch are not connected and the first and second conduction terminals of the switch are disconnected. Therefore, the charge switch circuit 21 is a switch that is turned ON and OFF to switch the connection or disconnection between the power block PB1 and the secondary battery unit 11, and the discharge switch circuit 22 is a switch that is turned ON or OFF to switch the connection or disconnection between the power block PB2 and the secondary battery unit 11.

The power block PB1 outputs a DC voltage based on the reference potential PREF from an output terminal. The output terminal of the power block PB1 is connected to the first conduction terminal of the charge switch circuit 21 through wiring L2. The power block PB1 is, for example, an AC/DC converter that converts an AC voltage supplied from a commercial AC power source to a DC voltage to output the DC voltage or is a solar battery unit that generates electricity from solar light to output a DC voltage based on the generated power, or is a combination of the converter and the unit.

In the switching circuit 15, the second conduction terminal of the charge switch circuit 21 is commonly connected to the first conduction terminal of the discharge switch circuit 22 at a connection point 23, and the connection point 23 is connected to the positive terminal 12 of the secondary battery unit 11 through the positive bus bar L1.

The second conduction terminal of the discharge switch circuit 22 is connected to an input terminal of the power block PB2 through wiring L3. The power block PB2 is a DC load that is driven using, as a drive voltage, a voltage applied to the input terminal based on the reference potential PREF. Alternatively, the power block PB2 may include a power conversion unit that converts the voltage applied to the input terminal of the power block PB2 based on the reference potential PREF to another voltage (DC voltage or AC voltage). The power block PB2 may further include a load that is driven by a voltage obtained from the conversion by the power conversion unit.

The switch control unit 16 switches and controls on/off of the charge switch circuit 21 and the discharge switch circuit 22. When the secondary battery unit 11 needs to be charged, the switch control unit 16 turns ON the charge switch circuit 21. When the charge switch circuit 21 is turned ON, the secondary battery unit 11 can be charged by the output power of the power block PB1. The switch control unit 16 can turn OFF the charge switch circuit 21 and turn ON the discharge switch circuit 22 to supply the discharge power of the secondary battery unit 11 to the power block PB2. The switch control unit 16 can also turn ON both the charge switch circuit 21 and the discharge switch circuit 22. When both the charge switch circuit 21 and the discharge switch circuit 22 are turned ON, the secondary battery unit 11 is charged with the output power of the power block PB1, and the power block PB2 is driven by the output power of the power block PB1. Switch information indicating ON/OFF states of the charge switch circuit 21 and the discharge switch circuit 22 is sequentially transmitted from the switch control unit 16 to the ground fault detection control unit 39 (hereinafter, also simply called "control unit 39"). Based on the content of the transmission, the ground fault detection control unit 39 can recognize the ON/OFF states of the charge switch circuit 21 and the discharge switch circuit 22 at arbitrary timing.

The electricity storage system 9 includes the ground fault detection circuit 29. The ground fault detection circuit 29 includes components referenced by reference numerals 31 to 38. The ground fault detection circuit 29 includes a series circuit of the first switch circuit 31, a resistance element 33, a resistance element 34, and the second switch circuit 32. The series circuit is connected between the positive terminal 12 and the negative terminal 13 of the secondary battery unit 11. More specifically, the first conduction terminals of the first switch circuit 31 and the second switch circuit 32 are connected to the positive terminal 12 and the negative terminal 13, respectively. The second conduction terminal of the first switch circuit 31 is connected to the second conduction terminal of the second switch circuit 32 through the series circuit of the resistance elements 33 and 34. A connection point 35 between the resistance elements 33 and 34 is grounded through a resistance element 36. More specifically, the connection point 35 is connected to a ground point 38 with a ground potential through the resistance element 36. The ground point 38 and the reference potential point 14 are insulated unless there is a ground fault in the electricity storage system 9. A signal processing unit 37 performs amplification, binarization, waveform shaping, and the like of a signal of a voltage generated in the resistance element 36 (voltage drop in the resistance element 36) to determine whether there is a ground fault in the electricity storage system 9. Although the signal processing unit 37 or the ground fault detection control unit 39 can perform the determination, it is assumed hereinafter that the ground fault detection control unit 39 determines whether there is a ground fault.

Figure 5:
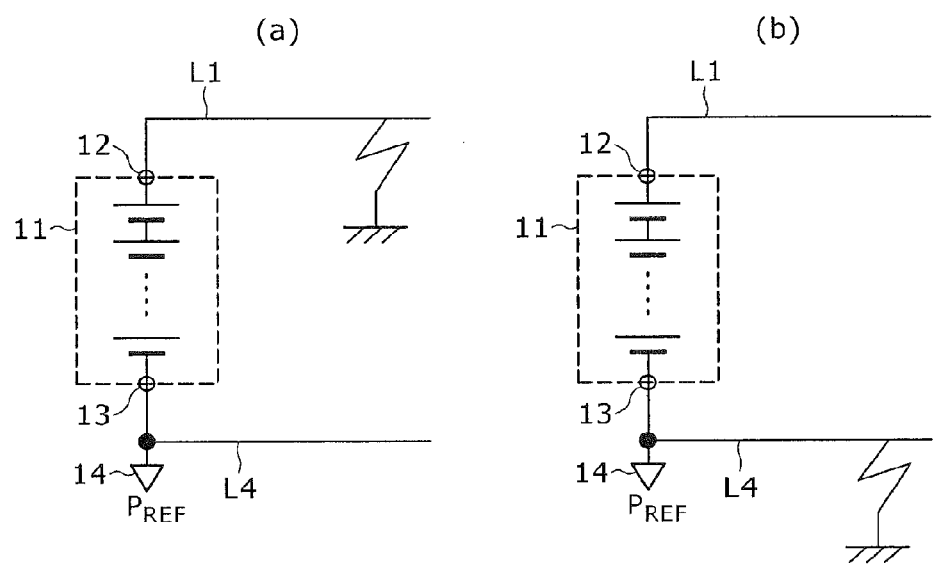
FIG. 5 is a view for explaining states of ground faults that may occur in the electricity storage system of FIG. 4.

The states of the ground fault in the electricity storage system 9 include a state of FIG. 5(a) and a state of FIG. 5(b). The state of FIG. 5(a) is a state in which the positive bus bar L1 is grounded or a state in which other wiring or another electronic component connected to the positive bus bar L1 is grounded. The state of FIG. 5(b) is a state in which the negative bus bar L4 is grounded or a state in which other wiring or another electronic component connected to the negative bus bar L4 is grounded. If the first switch circuit 31 and the second switch circuit 32 are OFF, a current loop that passes through the secondary battery unit 11 and the ground is not formed in the state of FIG. 5(a) or FIG. 5(b), and a current does not flow between the secondary battery unit 11 and the ground. However, if a human body (grounded human body) touches the negative bus bar L4 in the state of FIG. 5(a) or if a human body (grounded human body) touches the positive bus bar L1 in the state of FIG. 5(b), a current loop that passes through the body is formed, and a current flows through the human body. To prevent such an incident, the electricity storage system 9 uses the ground fault detection circuit 29 to detect the ground fault.

An operation of the ground fault detection using the ground fault detection circuit 29 will be described. In the ground fault detection, a signal SIG31 of the voltage generated in the resistance element 36 is acquired when only the first switch circuit 31 of the first switch circuit 31 and the second switch circuit 32 is turned ON, and then a signal SIG32 of the voltage generated in the resistance element 36 is acquired when only the second switch circuit 32 of the first switch circuit 31 and the second switch circuit 32 is turned ON. The ground fault detection control unit 39 controls ON/OFF switching of the first switch circuit 31 and the second switch circuit 32, and the signal processing unit 37 acquires the signals SIG31 and SIG32.

The ground fault detection control unit 39 uses the signal processing unit 37 based on the acquired voltage signal SIG31 to determine whether there is a ground fault in the state of FIG. 5(b). If there is no ground fault in the state of FIG. 5(b), a voltage is not generated in the resistance element 36, because a current loop passing through the secondary battery unit 11 and the ground is not formed even if the first switch circuit 31 is turned ON. However, if the first switch circuit 31 is turned ON when there is a ground fault in the state of FIG. 5(b), a current loop passing through the secondary battery unit 11, the first switch circuit 31, the resistance elements 33 and 36, and the ground is formed, and a voltage greater than a certain value is generated in the resistance element 36. Therefore, the ground fault detection control unit 39 can determine whether there is a ground fault in the state of FIG. 5(b) based on the voltage signal SIG31.

The ground fault detection control unit 39 uses the signal processing unit 37 based on the acquired voltage signal SIG32 to determine whether there is a ground fault in the state of FIG. 5(a). If there is no ground fault in the state of FIG. 5(a), a voltage is not generated in the resistance element 36, because a current loop passing through the secondary battery unit 11 and the ground is not formed even if the second switch circuit 32 is turned ON. However, if the second switch circuit 32 is turned ON when there is a ground fault in the state of FIG. 5(a), a current loop passing through the secondary battery unit 11, the second switch circuit 32, the resistance elements 34 and 36, and the ground is formed, and a voltage greater than a certain value is generated in the resistance element 36. Therefore, the ground fault detection control unit 39 can determine whether there is a ground fault in the state of FIG. 5(a) based on the voltage signal SIG32.

Figure 6:
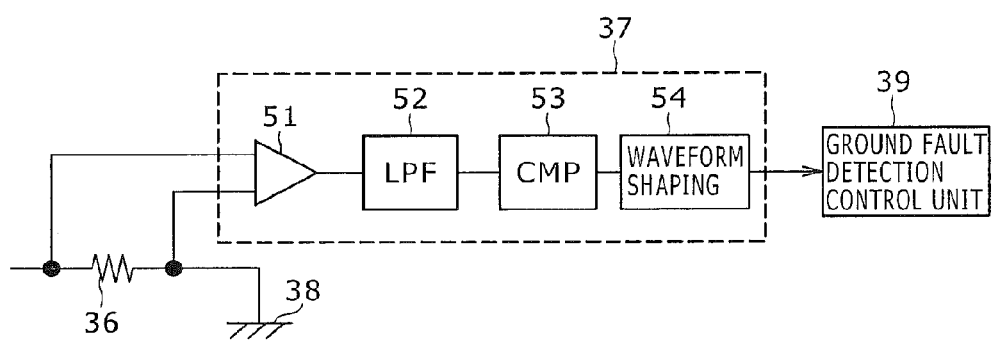
FIG. 6 is a view showing an example of an internal configuration of a ground fault generation circuit of FIG. 4.

FIG. 6 shows an example of an internal configuration of the signal processing unit 37. The signal processing unit 37 includes, for example, an amplifier 51 that amplifies a signal of the voltage generated in the resistance element 36, a low-pass filter 52 that removes high-pass frequency components of the voltage signal amplified by the amplifier 51, a comparator 53 that compares the voltage signal obtained through the low-pass filter 52 with a voltage signal of a predetermined voltage value to binarize the voltage signal obtained through the low-pass filter 52, and a waveform-shaping circuit 54 that shapes a waveform of the signal binarized by the comparator 53. The ground fault detection control unit 39 can determine whether the ground fault is generated based on the signal after the waveform shaping performed by the waveform-shaping circuit 54.

An operation in which the process of turning ON only the first switch circuit 31 of the first switch circuit 31 and the second switch circuit 32 to acquire the signal SIG31 to determine whether there is a ground fault in the state of FIG. 5(b) based on the signal SIG31 and the process of turning ON only the second switch circuit 32 of the first switch circuit 31 and the second switch circuit 32 to acquire the signal SIG32 to determine whether there is a ground fault in the state of FIG. 5(a) based on the signal SIG32 are executed once each will be particularly called a "unit ground fault detection operation." The ground fault detection includes one or more unit ground fault detection operations.

The execution of the ground fault detection involves power consumption associated with ON/OFF switching of the first switch circuit 31 and the second switch circuit 32. Therefore, it is not desirable to execute the ground fault detection more than necessary. Particularly, if the electricity storage system 9 is installed in a house or factory to be used to drive home appliances and the like instead of being arranged in a movable body, the ground fault state is not often degraded suddenly (in the second embodiment it is assumed that the electricity storage system 9 is installed in a house or factory to be used to drive home appliances and the like). Meanwhile, even if the ground fault detection is performed when the charge switch circuit 21 and the discharge switch circuit 22 are OFF in the electricity storage system 9 as shown in FIG. 4, the range that allows detection of whether the ground fault is generated is limited to a section that does not involve the charge switch circuit 21 and the discharge switch circuit 22. The ground fault may also occur in the power block PB1, the wiring L2, the wiring L3, or the power block PB2. Therefore, it is desirable to detect the ground fault at a section between the power blocks PB1 and PB2 and the switching circuit 15.

Figure 7:
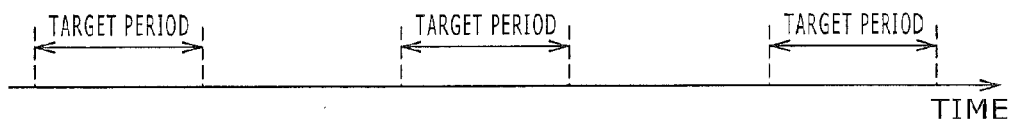
FIG. 7 is a conceptual view of a plurality of target periods according to the second embodiment of the present invention.

The ground fault detection control unit 39 takes these factors into consideration to perform a control operation for the ground fault detection. The control operation will be described with reference to FIG. 7 and the like. As shown in FIG. 7, the ground fault detection control unit 39 sets a plurality of target periods discretely arranged on a time base to control the ground fault detection circuit 29 to perform the ground fault detection only in the target periods. Therefore, there is a non-target period between two temporally adjacent target periods, and the ground fault detection is not performed in the non-target period. The ground fault detection control unit 39 sets one or more target periods a day. For example, if one target period is set for one day, the ground fault detection control unit 39 sets i target periods across i days (i is an integer). Although the ground fault detection control unit 39 and the ground fault detection circuit 29 collaborate to realize the ground fault detection, for simplicity of description, an operation in which the ground fault detection control unit 39 uses the ground fault detection circuit 29 to perform the ground fault detection (unit ground fault detection operation) will also be simply expressed as an operation of the ground fault detection (unit ground fault detection operation).

The ground fault detection control unit 39 includes a clock or a time acquisition unit (not shown) that acquires time information from the outside. The ground fault detection control unit 39 uses the clock or the time acquisition unit to recognize the current time. The ground fault detection control unit 39 does not perform the ground fault detection when the current time belongs to the non-target period and starts a ground fault detection sequence when the current time reaches the start time of the target period.

Figure 8:
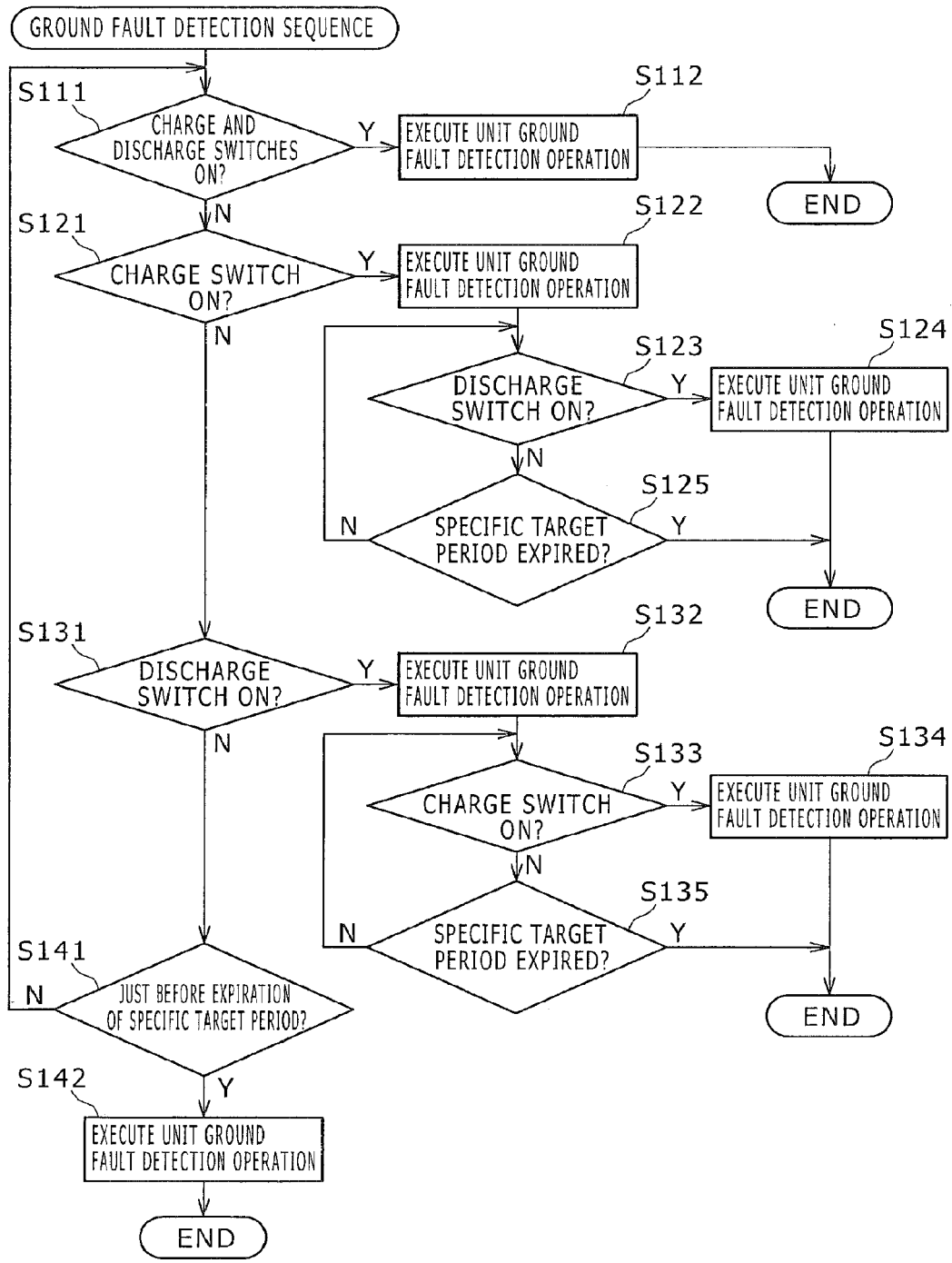
FIG. 8 is an operation flow chart of a ground fault detection sequence according to the second embodiment of the present invention.

FIG. 8 is an operation flow chart of the ground fault detection sequence. The ground fault detection control unit 39 executes and controls the process of steps shown in FIG. 8. Simply put, the ground fault detection control unit 39 uses the switch information to monitor whether the secondary battery unit 11 and the power block (at least one of the power blocks PB1 and PB2 in the second embodiment) are connected, and based on the monitoring result, performs the ground fault detection in a period in which the secondary battery unit 11 and the power block are connected through the switching circuit 15 (in other words, controls the ground fault detection circuit 29 to perform the ground fault detection). In the second embodiment, the switching circuit 15 includes the charge switch circuit 21 and the discharge switch circuit 22. Therefore, the ground fault detection control unit 39 performs the ground fault detection in a period in which at least one of the charge switch circuit 21 and the discharge switch circuit 22 is ON (in other words, controls the ground fault detection circuit 29 to perform the ground fault detection).

Although the ground fault detection control unit 39 basically finishes the ground fault detection sequence when the current time reaches the end time of the target period, the ground fault detection control unit 39 can also finish the ground fault detection sequence when necessary ground fault detection is completed even if the current time is not at the end time of the target period. A ground fault detection sequence executed in a target period (hereinafter, also called "specific target period") will be described with reference to FIG. 8.

In the ground fault detection sequence, the ground fault detection control unit 39 first determines in step S111 whether both the charge switch circuit 21 and the discharge switch circuit 22 are ON.

If both the charge switch circuit 21 and the discharge switch circuit 22 are ON in step S111, processing proceeds from step S111 to step S112. If the charge switch circuit 21 and the discharge switch circuit 22 are not both ON, processing proceeds from step S111 to step S121. The period in which both the charge switch circuit 21 and the discharge switch circuit 22 are ON will also be particularly called a "both-ON-period." In step S112, the ground fault detection control unit 39 executes the unit ground fault detection operation just once and finishes the ground fault detection sequence for the specific target period when the unit ground fault detection operation is completed. Therefore, in the case that reaches step S112, the ground fault detection in the specific target period is finished after the execution of the ground fault detection in the both-ON-period. After the end of the ground fault detection in the specific target period, a new unit ground fault detection operation is not executed in the specific target period.

In step S121, the ground fault detection control unit 39 determines whether the charge switch circuit 21 is ON. If the charge switch circuit 21 is ON in step S121, processing proceeds from step S121 to step S122. If the charge switch circuit 21 is OFF, processing proceeds from step S121 to step S131. A period in which at least the charge switch circuit 21 of the charge switch circuit 21 and the discharge switch circuit 22 is ON will also be particularly called a "charge-ON-period." In step S122, the ground fault detection control unit 39 executes the unit ground fault detection operation just once, and then processing proceeds to step S123.

In step S123, the ground fault detection control unit 39 determines whether the discharge switch circuit 22 is ON. If the discharge switch circuit 22 is ON in step S123, processing proceeds from step S123 to step S124. If the discharge switch circuit 22 is OFF, processing proceeds from step S123 to step S125. When processing proceeds from step S123 to step S124, not only the discharge switch circuit 22, but also the charge switch circuit 21 may be ON. A period in which at least the discharge switch circuit 22 of the charge switch circuit 21 and the discharge switch circuit 22 is ON will also be particularly called a "discharge-ON-period." In step S124, the ground fault detection control unit 39 executes the unit ground fault detection operation just once and finishes the ground fault detection sequence for the specific target period if the unit ground fault detection operation is completed. Therefore, in the case that reaches step S124, the ground fault detection in the specific target period is finished after the execution of the ground fault detection in the charge-ON-period in step S122 and the execution of the ground fault detection in the discharge-ON-period in step S124.

In step S125, the ground fault detection control unit 39 compares the current time and the end time of the specific target period to determine whether the specific target period has expired. If the specific target period has not expired in step S125, processing returns from step S125 to step S123. If the specific target period has expired, the ground fault detection control unit 39 finishes the ground fault detection sequence for the specific target period. Therefore, in the case in which the ground fault detection sequence is finished without involving step S124 after steps S121 and S122, the ground fault detection in the specific target period is finished when the specific target period has expired after the execution of the ground fault detection in the charge-ON-period in step S122.

In step S131, the ground fault detection control unit 39 determines whether the discharge switch circuit 22 is ON. If the discharge switch circuit 22 is ON in step S131, processing proceeds from step S131 to S132. If the discharge switch circuit 22 is OFF, processing proceeds from step S131 to step S141. In step S132, the ground fault detection control unit 39 executes the unit ground fault detection operation just once, and then processing proceeds to step S133.

In step S133, the ground fault detection control unit 39 determines whether the charge switch circuit 21 is ON. If the charge switch circuit 21 is ON in step S133, processing proceeds from step S133 to step S134. If the charge switch circuit 21 if OFF, processing proceeds from step S133 to step S135. When processing proceeds from step S133 to step S134, not only the charge switch circuit 21, but also the discharge switch circuit 22 may be ON. In step S134, the ground fault detection control unit 39 executes the unit ground fault detection operation just once and finishes the ground fault detection sequence for the specific target period when the unit ground fault detection operation is completed. Therefore, in the case that reaches step S134, the ground fault detection in the specific target period is finished after the execution of the ground fault detection in the discharge-ON-period in step S132 and the execution of the ground fault detection in the charge-ON-period in step S134.

In step S135, the ground fault detection control unit 39 compares the current time and the end time of the specific target period to determine whether the specific target period has expired. If the specific target period has not expired in step S135, the process returns from step S135 to step S133. If the specific target period has expired, the ground fault detection control unit 39 finishes the ground fault detection sequence for the specific target period. Therefore, in the case in which the ground fault detection sequence is finished without involving step S134 after steps S131 and S132, the ground fault detection in the specific target period is finished when the specific target period has expired after the execution of the ground fault detection in the discharge-ON-period in step S132.

In step S141, the ground fault detection control unit 39 determines whether the remaining time until the expiration of the specific target period is equal to or less than a predetermined time. If the remaining time is equal to or less than the predetermined time, processing proceeds from step S141 to step S142. If the remaining time is not equal to or less than the predetermined time, the process returns from step S141 to step S111, and step S111 and the processing after step S111 are repeated.

In step S142, the ground fault detection control unit 39 executes the unit ground fault detection operation just once and finishes the ground fault detection sequence for the specific target period when the unit ground fault detection operation is completed. The timing of the execution of the unit ground fault detection operation in step S142 is timing based on end timing of the specific target period and is, for example, timing that is Δt before the end timing of the specific target period. In this case, Δt denotes a time necessary to execute the unit ground fault detection operation once or is a time obtained by adding a small margin to the time necessary to execute the unit ground fault detection operation once. Therefore, in the case that reaches step S142, the ground fault detection is performed at the timing based on the end timing of the specific target period, and then the ground fault detection in the specific target period is finished quickly.

Each target period is handled as a specific target period, and the ground fault detection sequence described with reference to FIG. 8 is executed in each target period. When a ground fault is detected in the ground fault detection sequence, the ground fault detection control unit 39 can visually and acoustically notify the user of the detection.

The discrete setting of the target periods as described above can reduce the power consumption for the ground fault detection, as compared to the case of a system in which the first switch circuit 31 and the second switch circuit 32 are always alternately turned ON. In each target period, the ground fault detection is performed in a period in which at least one of the charge switch circuit 21 and the discharge switch circuit 22 is ON. In this way, the ground fault detection can be performed for a section between the power block (PB1 and/or PB2) and the switching circuit 15 with little power consumption. A state in which the charge switch circuit 21 and the discharge switch circuit 22 are not ON may continue depending on the time zone (time of day) of the target period. Even in such a case, the ground fault detection is performed at least once (step S142). In this way, the ground fault detection for the section from the secondary battery unit 11 to the switching circuit 15 is secured in each target period.

The ground fault detection control unit 39 can arbitrarily set the start time of the target period and the length of the target period. However, it is desirable to set the start time of each target period at midnight or in the early morning, in order to suppress the influence of noise on the ground fault detection to the extent possible. For example, midnight denotes a time zone belonging to a midnight power time zone, and the early morning denotes a time zone just after the midnight power time zone. The midnight power time zone is one of a plurality of time zones set by a power company that supplies commercial AC power to a district provided with the electricity storage system 9, and for example, 1 a.m. belongs to the midnight power time zone.

Based on the switch information transmitted from the switch control unit 16 on a daily basis, the ground fault detection control unit 39 can learn a time zone in which the charge switch circuit 21 and the discharge switch circuit 22 are ON (hereinafter, called "both-ON time zone"), learn a time zone in which at least the charge switch circuit 21 of the charge switch circuit 21 and the discharge switch circuit 22 is ON (hereinafter, called "charge-ON time zone"), or learn a time zone in which at least the discharge switch circuit 22 of the switches 21 and 22 is ON (hereinafter, called "discharge-ON time zone") to set subsequent target periods (e.g. start time of the target periods) based on the learning results. In this case, it is also desirable to set one or more target periods a day (therefore, it is desirable that an interval between two temporally adjacent target periods is less than 24 hours).

For example, the ground fault detection control unit 39 can statistically learn, across a plurality of days, what kind of time zone the both-ON time zone is and can include, in each of the following target periods, a time zone with a statistically high possibility of being the both-ON time zone. Simply put, for example, if it becomes clear from learning that there is a both-ON time zone between 9 p.m. and 10 p.m. every day, the ground fault detection control unit 39 can include the time zone between 9 p.m. and 10 p.m. in each of the following target periods.

For example, if it becomes clear from learning that there is a charge-ON time zone between 5 p.m. and 6 p.m. every day and that there is a discharge-ON time zone between 10 p.m. and 11 p.m. although the both-ON time zone is irregular, the ground fault detection control unit 39 may set two target periods each day. The ground fault detection control unit 39 may include the time zone between 5 p.m. and 6 p.m. in one of the target periods and include the time zone between 10 p.m. and 11 p.m. in the other target period.

As a result of setting the target periods through the learning, each target period can include optimal time zones that allow performing the ground fault detection of the section between the power block (PB1 and/or PB2) and the switching circuit 15.

<<Modifications>>

The first and second embodiments can be appropriately changed in various ways within the scope of the technical concept indicated in the claims. The embodiments are just examples of the embodiments of the present invention, and the present invention and the meaning of the terms of the constituent elements are not limited to those described in the embodiments. The specific numerical values shown in the description are illustrative only, and obviously, numerical values can be changed in various ways. The following annotations 1 to 5 are annotation items applicable to the embodiments. The contents described in the annotations can be arbitrarily combined so long as there is no inconsistency.

[Annotation 1]

The configuration of the ground fault detection circuit 29 is illustrative, and the ground fault detection circuit can be formed by an arbitrary circuit that can perform the ground fault detection. For example, a zero phase current transformer may be used to form the ground fault detection apparatus.

[Annotation 2]

Although FIG. 4 illustrates the switch control unit 16 and the ground fault detection control unit 39 as separate control units, the switch control unit 16 and the ground fault detection control unit 39 may form one control unit.

[Annotation 3]

All or part of the electricity storage system 9 shown in FIG. 4 can be mounted on various other systems and devices. For example, the electricity storage system 9 may be mounted on a movable body (such as an electrical vehicle, a ship, an airplane, an elevator, or a walking robot) or an electronic device (such as a personal computer or a mobile terminal) that is driven using the discharge power of the secondary battery unit 11 or may be incorporated into a power system of a house or a factory.

[Annotation 4]

The switch control unit 16 and the ground fault detection control unit 39 can be formed by hardware or by a combination of hardware and software. A function realized using the software may be written as a program, and the program may be executed on a program execution apparatus (e.g. computer) to realize the function.

[Annotation 5]

The electricity storage system 9 of FIG. 4 can include a ground fault detection apparatus. The ground fault detection apparatus included in the electricity storage system 9 includes at least the ground fault detection circuit 29 and the ground fault detection control unit 39 as constituent elements and may further include other arbitrary components shown in FIG. 4 (such as the switching circuit 15) as constituent elements.

The invention claimed is:

1. A ground fault detection circuit comprising:
    a first switch circuit that connects or disconnects a first path between a positive bus bar and a ground potential section, the positive bus bar being connected to a positive electrode of a plurality of secondary battery units connected in parallel through a field-effect transistor including a parasitic diode;
    a second switch circuit that connects or disconnects a second path between a negative bus bar and the ground potential section, the negative bus bar being connected to a negative electrode of the plurality of secondary battery units connected in parallel; and
    a ground fault detection unit configured to detect a ground fault of the positive bus bar or the negative bus bar based on an electric current flowing through the first path or the second path when both of the first switch circuit and the second switch circuit are in a disconnected state; wherein
    the ground fault detection unit detects the ground fault based on the electric current in a state in which only one of the first path and the second path is connected; and wherein
    the plurality of secondary battery units connected in parallel includes a plurality of secondary batteries connected in series, and
    the ground fault detection unit detects a ground fault between the plurality of secondary batteries based on an electric current flowing through the first path in a state in which the first path is connected and based on an electric current flowing through the second path in a state in which the second path is connected.

2. The ground fault detection circuit according to claim 1, wherein
    the ground fault detection unit outputs a signal for disconnecting all disconnection circuits connected in series to the plurality of secondary battery units connected in parallel when a ground fault is detected.

3. The ground fault detection circuit according to claim 2, wherein
    the ground fault detection unit comprises:
    an I/V conversion unit that converts the electric current of the first path or the electric current of the second path to a voltage value;
    a comparison unit that compares an output value of the I/V conversion unit with the predetermined threshold; and
    a determination unit that determines that there is a ground fault when a time over which the output value of the I/V conversion unit is beyond the predetermined threshold continues for a predetermined time.

4. A ground fault detection apparatus comprising:
    the ground fault detection circuit according to claim 1; and
    a control unit that controls execution timing of the detection of the ground fault, wherein
    the control unit sets a plurality of target periods discretely arranged on a time line and controls the ground fault detection circuit to detect the ground fault in each target period.

5. The ground fault detection apparatus according to claim 4, wherein
    between the plurality of secondary battery units connected in parallel and power blocks that output power or receive power, a switching circuit that switches connection or disconnection between the plurality of secondary battery units connected in parallel and the power blocks exists, and
    in each target period, the control unit controls the ground fault detection circuit to detect the ground fault in a period in which the plurality of secondary battery units connected in parallel and the power blocks are connected.

6. The ground fault detection apparatus according to claim 5, wherein
    the power blocks include: a first power block that outputs power; and a second power block that receives power,
    the switching circuit includes: a first switch that exists between the first power block and the plurality of secondary battery units connected in parallel and that turns ON or OFF to switch connection or disconnection between the first power block and the plurality of secondary battery units connected in parallel; and a second switch that exists between the second power block and the plurality of secondary battery units connected in parallel and that turns ON or OFF to switch connection or disconnection between the second power block and the plurality of secondary battery units connected in parallel, and
    in each target period, the control unit controls the ground fault detection circuit to detect the ground fault in a period in which at least one of the first and second switches is ON.

7. The ground fault detection apparatus according to claim 6, wherein
if a specific target period that is one of the plurality of target periods includes a both-ON-period in which both the first and second switches are ON,
the control unit controls the ground fault detection circuit to detect the ground fault in the both-ON-period.

8. The ground fault detection apparatus according to claim 6, wherein
if a specific target period that is one of the plurality of target periods includes a first-ON-period in which the first switch is on and a second-ON-period in which the second switch is ON,
the control unit controls the ground fault detection circuit to detect the ground fault in each of the first- and second-ON-periods.

9. The ground fault detection apparatus according to claim 6, wherein
if a specific target period that is one of the plurality of target periods includes a first-ON-period in which the first switch is ON and a second-ON-period in which the second switch is ON,
the control unit controls the ground fault detection circuit to detect the ground fault in the first- or second-ON-period included in the specific target period.

10. The ground fault detection apparatus according to claim 6, wherein
if none of the first and second switches is ON in a specific target period that is one of the plurality of target periods,
the control unit causes the ground fault detection circuit to detect the ground fault at timing based on end timing of the specific target period and then finishes the ground fault detection in the specific target period.

11. The ground fault detection apparatus according to claim 4, wherein
the control unit sets the plurality of target periods across a plurality of days so that one or more target periods are set for each day.

12. The ground fault detection apparatus according to claim 5, wherein
the control unit learns a time zone in which the plurality of secondary battery units connected in parallel and the power blocks are connected and sets each target period based on a learning result.

* * * * *